United States Patent [19]
Buhler et al.

[11] Patent Number: 5,144,311
[45] Date of Patent: Sep. 1, 1992

[54] APPARATUS FOR CONVERTING ANALOG SIGNALS INTO DIGITAL SIGNALS

[75] Inventors: Wolfhardt Buhler, Munich; Hans Poisel, Dachau; Gert Trommer, Munich, all of Fed. Rep. of Germany

[73] Assignee: Messerschmitt-Bölkow-Blohm GmbH, Munich, Fed. Rep. of Germany

[21] Appl. No.: 464,441

[22] Filed: Jan. 12, 1990

[30] Foreign Application Priority Data

Jan. 19, 1989 [DE] Fed. Rep. of Germany ....... 3901399

[51] Int. Cl.⁵ .................. H03M 1/12; H03M 1/50; H03M 1/06
[52] U.S. Cl. .................................. 341/166; 341/155; 341/118; 341/163
[58] Field of Search ............... 341/163, 155, 166–170, 341/142, 118, 157, 143, 164

[56] References Cited

U.S. PATENT DOCUMENTS

| | | | |
|---|---|---|---|
| 3,316,751 | 5/1967 | Burk. | |
| 4,229,703 | 10/1980 | Bustin | 341/118 X |
| 4,315,254 | 2/1982 | Honjyo et al. | 341/120 |
| 4,490,713 | 12/1984 | Morozowski et al. | 341/163 |
| 4,511,883 | 4/1985 | Komoto | 341/163 |
| 4,527,148 | 7/1985 | Kuboki et al. | 341/163 |
| 4,594,578 | 6/1986 | Walsh | 341/167 |
| 4,851,843 | 7/1989 | Neal | 341/168 X |

FOREIGN PATENT DOCUMENTS

| | | | |
|---|---|---|---|
| 0016130 | 5/1972 | Japan | 341/163 |
| 0267017 | 11/1988 | Japan | 341/163 |
| 1150772 | 4/1985 | U.S.S.R. | 341/163 |

Primary Examiner—Sharon D. Logan
Attorney, Agent, or Firm—Kenyon & Kenyon

[57] ABSTRACT

An analog-digital converter having an analog integrator which integrates the difference between the analog input signal and a signal from, for example, a digital-analog converter controlled by a microprocessor, whereby a high resolution and a very high operating speed are rendered possible with a relatively low degree of complexity and minimal noise.

9 Claims, 1 Drawing Sheet

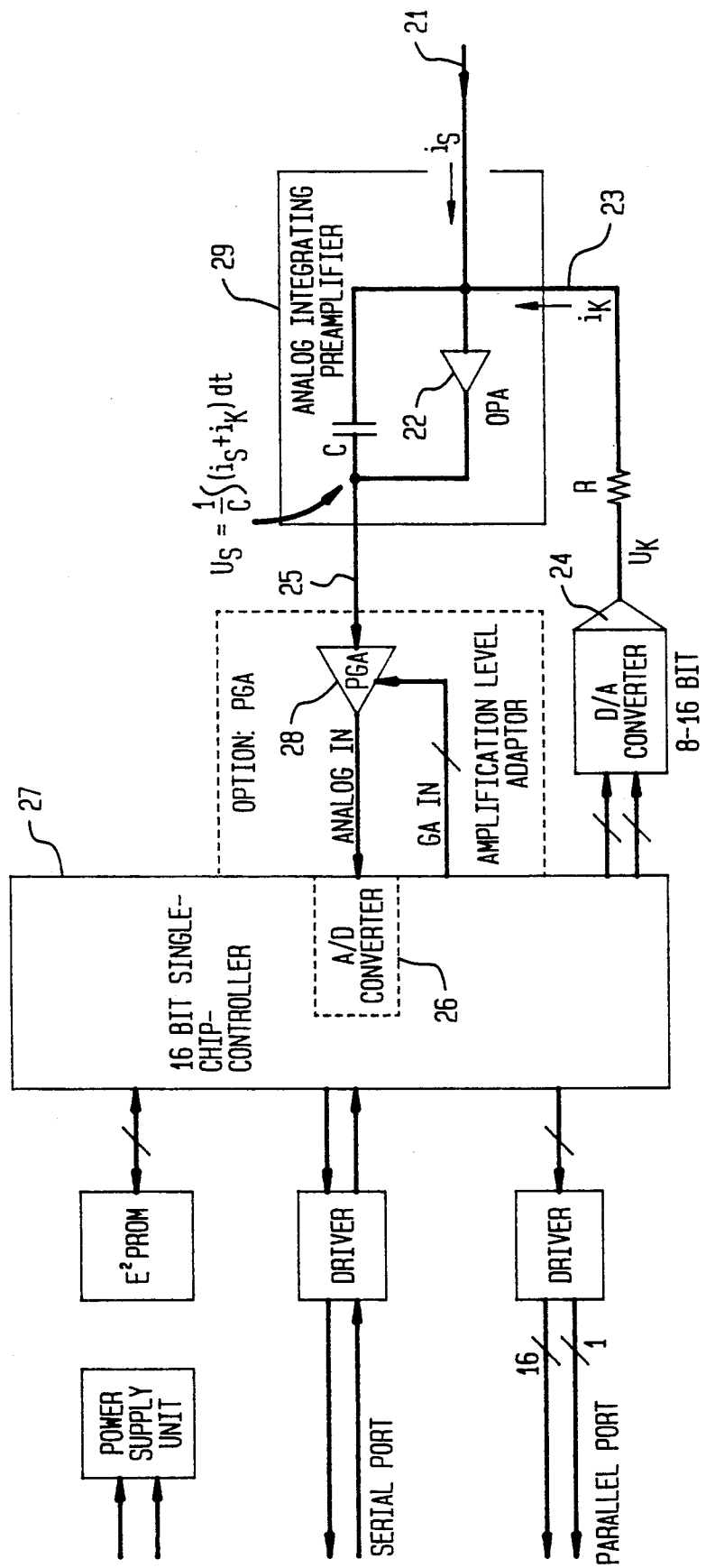

APPARATUS FOR CONVERTING ANALOG SIGNALS INTO DIGITAL SIGNALS

BACKGROUND OF THE INVENTION

Modern data acquisition systems employ analog digital converters of essentially three types: Converters with very short conversion times, so-called half-flash converters; converters which operate according to the successive approximation (SAR) method, where the input voltage is compared to the output voltage of a digital-analog converter, which is controlled by the SAR register; and integrating converters, which are applied wherever short conversion times are not required. In the case of the so-called half-flash converter, the internal resistance must be small in order to keep error to a minimum. With regard to their input voltage, the SAR converters are very sensitive. As far as internal resistance is concerned, the most insensitive of all three types of converters in any case is the integrating converter. However, with this type of converter, one must be aware of the fact that the input current is essentially a leakage current and that when several integration levels are involved, the errors add up.

SUMMARY OF THE INVENTION

An object of the invention is to provide a configuration for analog to digital conversion of the third type, and which, in particular, in spite of low circuit expenditure and greater conversion speed, avoids quantization errors.

The above and other objects of the present invention are achieved by an apparatus for converting analog signals into digital signals with a single or multi-stage amplifier, which forms the input circuit of an analog-digital converter, whose digital output data are fed to a microprocessor or microcomputer, at least one amplifier of the input circuit comprising an integrator with capacitance included in a feedback path, wherein the difference between the analog measuring signal and a further signal controlled by the microprocessor or microcomputer by means of digital-analog conversion is applied to the input of the integrator, the integrator being controlled through the signal feedback without being reset, so that the integrator never becomes saturated, and the digital value acquired within one measuring interval being formed from the sum of the value of the digital-analog converter and of the change in the integrator signal detected by the analog-digital converter.

Important advantages of the invention are: reduced or no quantization errors, higher resolution, less noise, greater speed and a lesser degree of complexity.

With the invention, a rapidly changing analog voltage, upon which noise and interfering signals are superimposed, is capable of being scanned within a fixed time reference and digitized, whereby the instantaneous value of the applied voltage is detected with the greatest possible accuracy. Furthermore, with the invention, the integration can be made from the digital values over long periods of time with minimal errors. The sampling rate between two sampling instants is no longer of importance for the integration, nor is the limited bit number of the analog-digital converter, which, in the current state of technological development, can lead to digitization errors. Both kinds of errors can lead to an integrated signal error which becomes greater with time. The invention avoids these errors with a level of complexity which is amazingly low.

BRIEF DESCRIPTION OF THE DRAWING

An exemplified embodiment of the invention is depicted schematically in the single drawing FIGURE.

DETAILED DESCRIPTION

With reference now to the drawing, in the converter according to the invention, in the area of the input circuit for a microprocessor or microcomputer, as the FIGURE shows, the analog measuring signal 21 is integrated in the analog preamplifier 22, together with a signal 23 of a digital-analog converter 24 preamplifier 22 may be a single or multi-stage amplifier. At this point, the analog integrating signal 25 is digitized by an analog-digital converter 26, on which no special demands have to be made, especially not concerning the bit number, and fed to the microprocessor or microcomputer 27. It is advantageous when the analog-digital converter 26 is integrated into microprocessor or microcomputer 27.

For special requirements in the dynamic operating range (according to the selection of R and C, the product of the resolution of the analog-digital converter and of the resolution of the digital-analog converter), an amplification-level adapter PGA 28 (PGA=programmable gain-amplifier) can also be included in the input circuit of the analog-digital converter and of the data acquisition system with the microprocessor or microcomputer and, in particular, connected to the integrator 29 on the load side.

The task of the microprocessor or microcomputer is, first of all, to assure, with the help of the digital-analog converter 24, that in a closed loop of the input circuit, the integrator 29, which in this case can neither be cleared nor reset, does not become saturated. The measured value to be determined in a specific measuring interval corresponds then to the sum of the value of the digital-analog converter and the change in the integrating signal, in view of the scale factors and offset (deviations) given by the circuit elements.

The resolution of the response threshold is thereby no longer limited by the analog-digital converter, but rather, at least with the application of a PGA 28, only limited, in the case of a defined measuring interval, by the signal-to-noise ratio of the measuring signal. Optimum noise and interference suppression is guaranteed by using the processor-controlled, integrating converter. The invention is most effective for larger quantities, because the digital-analog converter is much less expensive than other analog-digital converters of the same resolution.

As a variation of the exemplified embodiment, the digital-analog converter 24 can be dispensed with, when, in its place, the microprocessor or microcomputer has pulse-width modulated outputs, which are connected to the integrator 29.

An advantageous application of the invention is for inertial systems, in particular optical-fiber gyroscopes. As a rule, these systems have three outputs for the three space axes, and they are advantageously operated in parallel with several input circuits, in this case three. If one wants to integrate the digital output signal, in this case, for example, of a rate of rotation, whose time-related integration first supplies a course (positional) angle, then the result is not adversely affected by scanning errors or poor resolution of the analog-digital converter.

One of skill in the art, of course, can modify this exemplified embodiment without abandoning the general principle of the solution according to the invention.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. An input circuit for connection to an analog-to-digital converter, comprising:
    computer means for controlling operation of the input circuit;
    an integrator that further comprises first amplifier means and a capacitor means connected between an input and output of the first amplifier in a feedback connection, the input to the integrator being the input of the first amplifier means and the output of the integrator being the output of the first amplifier means, with the input to the integrator being a summed signal including a measuring signal and a signal output from a digital-to-analog converter;
    a programmable amplifier that has an input that connects to the output of the integrator and an output that connects to the input of an analog-to-digital converter, the analog-to-digital converter having an output that connects to an input to the computer means, the programmable amplifier for programmably amplifying signals input thereto from the integrator;
    digital-to-analog converter that has an input that connects to an output of the computer means and the output connects to the input of the integrator, the digital-to-analog converter for converting signals output from the computer means that control integrator operations so the output of the integrator remains in a non-saturated region; and
    resistor means connected between the output of the digital-to-analog converter and the input to the integrator, the resistor means having a predetermined relationship with the capacitor means for integrating the summed signal input to the integrator.

2. The input circuit recited in claim 1, wherein the digital-to-analog converter comprises means for emitting pulse-width modulated signals, the pulse-width modulated signal being coupled to the integrator.

3. The input circuit recited in claim 1, wherein the programmable amplifier is controlled by the computer means.

4. The input circuit recited in claim 1, wherein the analog-to-digital converter is integral with the computer means.

5. The input circuit recited in claim 1, wherein the first amplifier includes a preamplifier.

6. The input circuit recited in claim 1, wherein the computer means is connected to several input circuits operating in parallel.

7. The input circuit recited in claim 1, wherein the first amplifier comprises a single stage amplifier.

8. The input circuit recited in claim 1, wherein the first amplifier comprises a multi-stage amplifier.

9. The input circuit recited in claim 1, wherein the computer means comprises a microprocessor or microcomputer.

* * * * *